US012559838B2

(12) United States Patent
Park et al.

(10) Patent No.: US 12,559,838 B2
(45) Date of Patent: Feb. 24, 2026

(54) SEALING STRUCTURE AND MANUFACTURING METHOD THEREFOR

(71) Applicant: IUCF-HYU (INDUSTRY-UNIVERSITY COOPERATION FOUNDATION HANYANG UNIVERSITY), Seoul (KR)

(72) Inventors: Jin-Seong Park, Seongnam-si (KR); Ju-Hwan Han, Seoul (KR); Seong-Hyeon Lee, Busan (KR); Seok-Goo Jeong, Goyang-si (KR)

(73) Assignee: IUCF-HYU (INDUSTRY-UNIVERSITY COOPERATION FOUNDATION HANYANG UNIVERSITY), Seoul (KR)

(*) Notice: Subject to any disclaimer, the term of this patent is extended or adjusted under 35 U.S.C. 154(b) by 673 days.

(21) Appl. No.: 17/625,541

(22) PCT Filed: Aug. 3, 2020

(86) PCT No.: PCT/KR2020/010226
§ 371 (c)(1),
(2) Date: Jan. 7, 2022

(87) PCT Pub. No.: WO2021/025411
PCT Pub. Date: Feb. 11, 2021

(65) Prior Publication Data

US 2022/0278298 A1 Sep. 1, 2022

(30) Foreign Application Priority Data

Aug. 5, 2019 (KR) ........................ 10-2019-0094862

(51) Int. Cl.
*C23C 16/50* (2006.01)
*C23C 16/34* (2006.01)
(Continued)

(52) U.S. Cl.
CPC .......... *C23C 16/345* (2013.01); *C23C 16/401* (2013.01); *C23C 16/4408* (2013.01);
(Continued)

(58) Field of Classification Search
None
See application file for complete search history.

(56) References Cited

U.S. PATENT DOCUMENTS 9,343,317 B2 * 5/2016 Omstead ........... C23C 16/45534
2015/0279681 A1 * 10/2015 Knoops ............. H01L 21/02274
427/8
(Continued)

FOREIGN PATENT DOCUMENTS

JP 10-2018-0028850 A 3/2018
KR 10-1372441 B1 3/2014
(Continued)

OTHER PUBLICATIONS

Machine Translation of KR-2018127250-A.*
International Search Report for PCT/KR2020/010226 dated, Nov. 16, 2020 (PCT/ISA/210).

*Primary Examiner* — David P Turocy
(74) *Attorney, Agent, or Firm* — Sughrue Mion, PLLC

(57) ABSTRACT

A method for manufacturing a sealing structure may comprise the steps of: providing a substrate in a chamber; forming a first material layer containing a silicon nitride (SiNx) on the substrate; and forming a second material layer containing a silicon oxide (SiOx) on the first material layer, wherein the step of forming the first material layer and the step of forming the second material layer are performed by
(Continued)

a plasma-enhanced atomic layer deposition (PEALD) method.

4 Claims, 9 Drawing Sheets

(51) Int. Cl.

| | |
|---|---|
| ***C23C 16/40*** | (2006.01) |
| ***C23C 16/44*** | (2006.01) |
| ***C23C 16/455*** | (2006.01) |
| ***H10K 59/80*** | (2023.01) |
| ***H10K 77/10*** | (2023.01) |
| *H10K 71/00* | (2023.01) |

(52) U.S. Cl.
CPC ... *C23C 16/45538* (2013.01); *H10K 59/8731* (2023.02); *H10K 77/111* (2023.02); *H10K 71/00* (2023.02)

(56) References Cited

U.S. PATENT DOCUMENTS

2015/0376211 A1* 12/2015 Girard ............... C23C 16/45553
556/412
2018/0223429 A1* 8/2018 Fukazawa ......... C23C 16/45565

FOREIGN PATENT DOCUMENTS

| | | | | |
|---|---|---|---|---|
| KR | 10-2015-0037669 A | 4/2015 | | |
| KR | 10-2015-0129841 A | 11/2015 | | |
| KR | 10-2016-0079990 A | 7/2016 | | |
| KR | 10-2018-0050863 A | 5/2018 | | |
| KR | 10-1884555 B1 | 8/2018 | | |
| KR | 10-2018-0127250 A | 11/2018 | | |
| KR | 2018127250 A * | 11/2018 | ........... | C23C 16/345 |
| KR | 10-1964265 B1 | 7/2019 | | |

* cited by examiner

【Fig. 1】
(a)
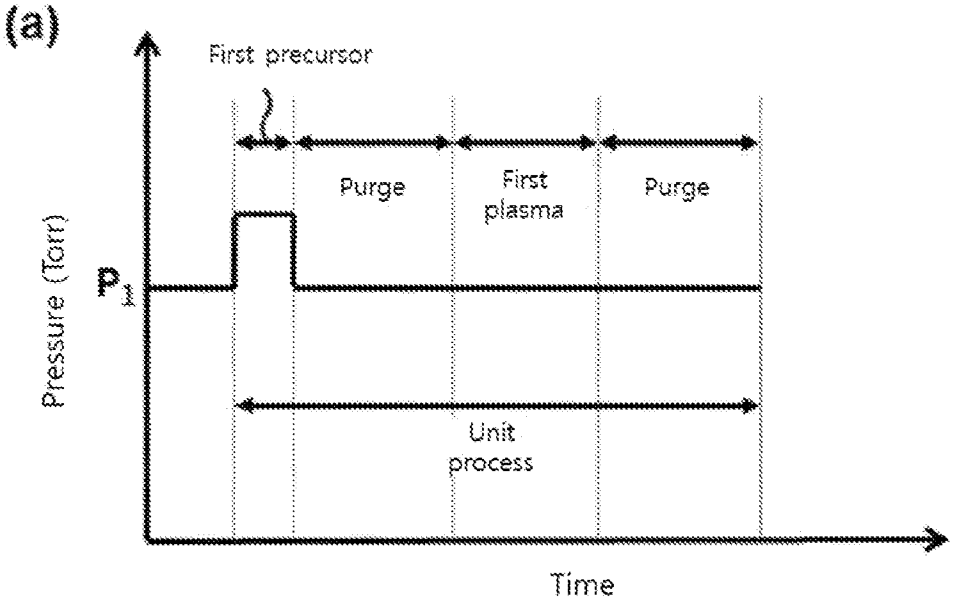
(b)
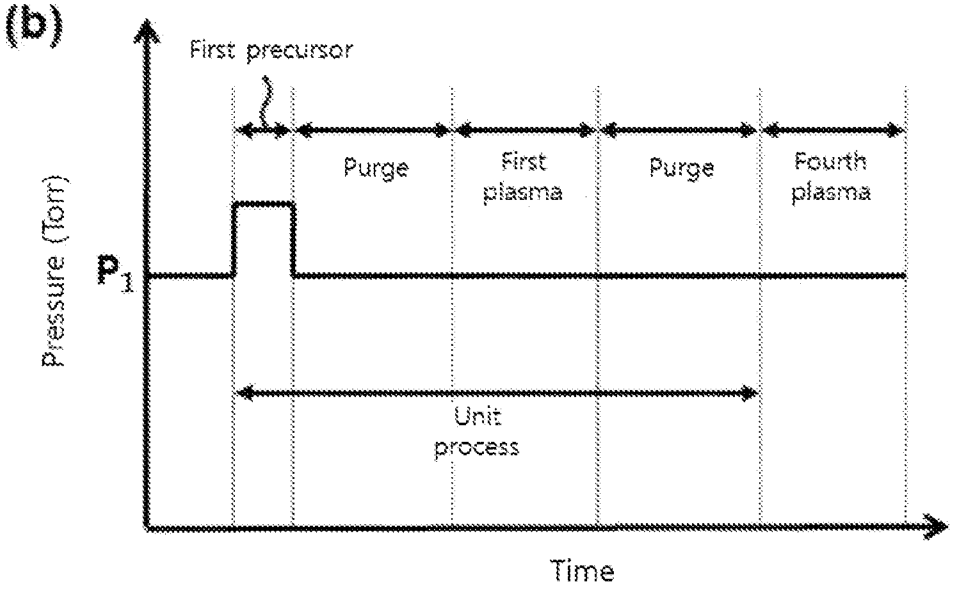

【Fig. 2】
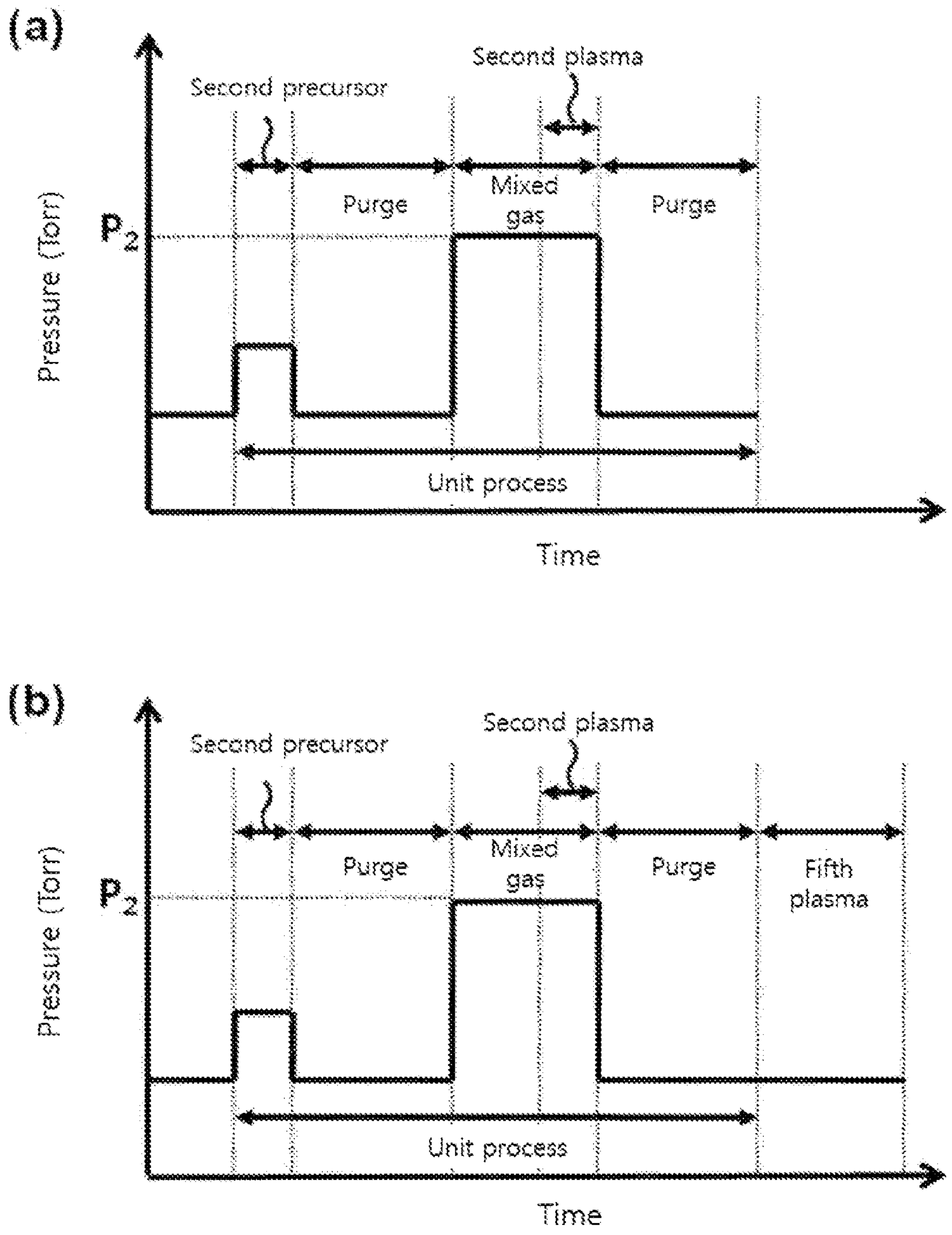

【Fig. 3】
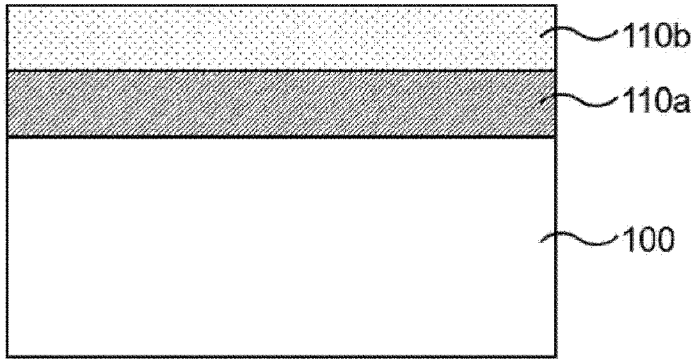

【Fig. 4】
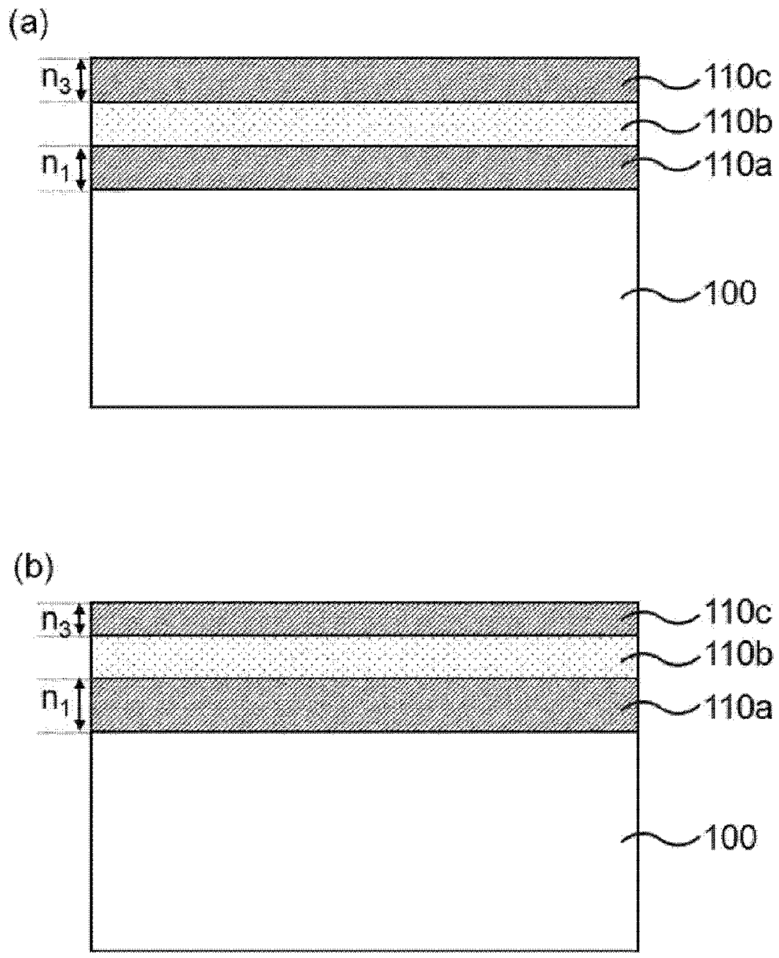

【Fig. 5】
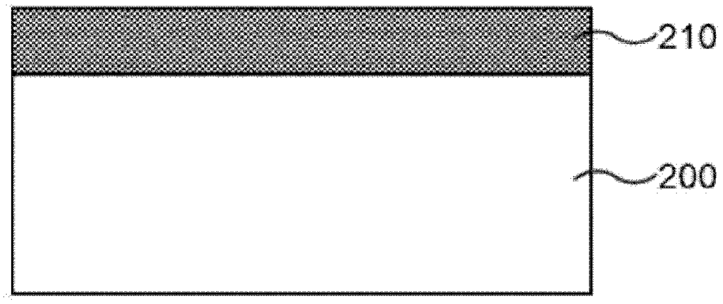

【Fig. 6】
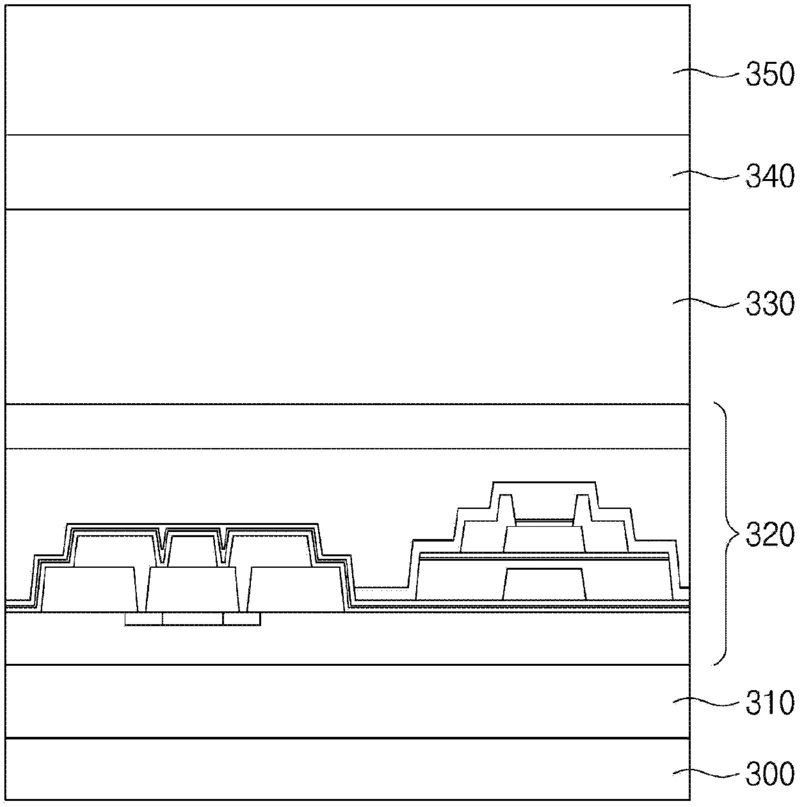

【Fig. 7】
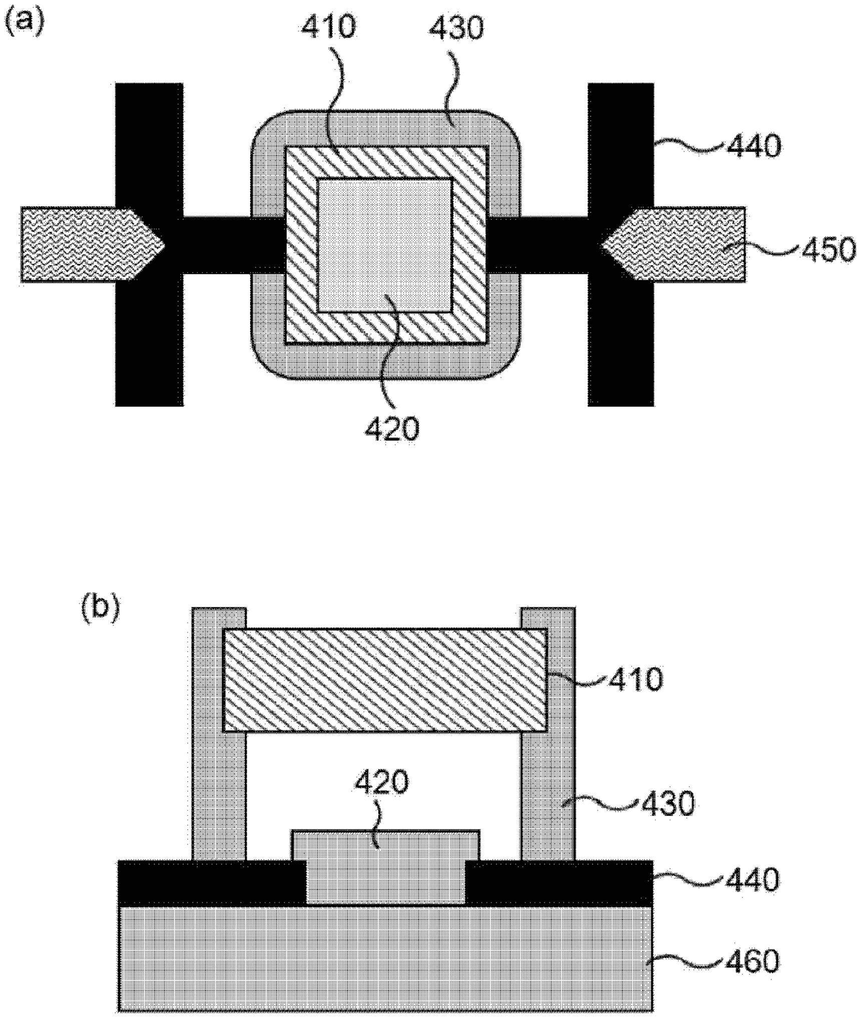

【Fig. 8】
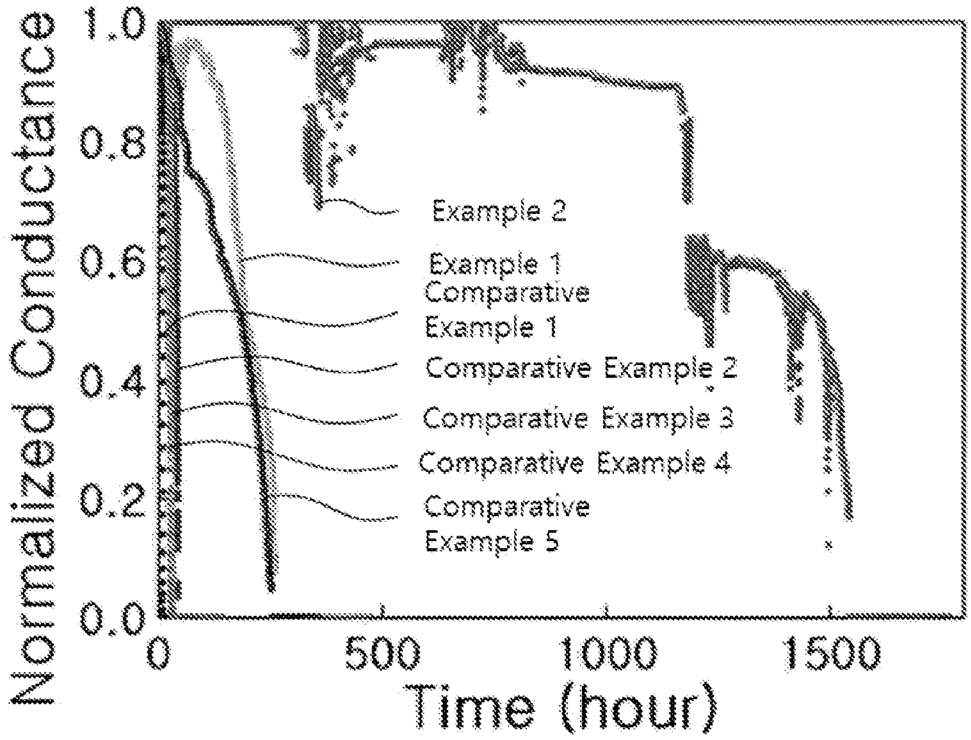

【Fig. 9】
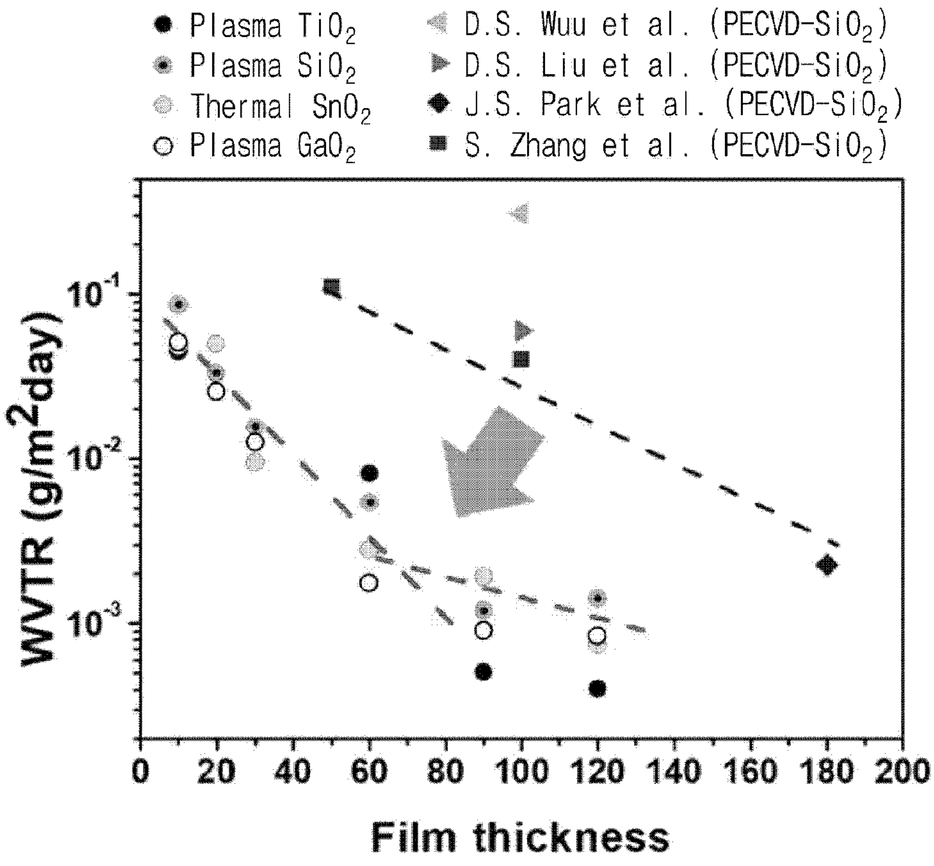

SEALING STRUCTURE AND MANUFACTURING METHOD THEREFOR

CROSS REFERENCE TO RELATED APPLICATIONS

This application is a National Stage of International Application No. PCT/KR2020/010226 filed Aug. 3, 2020, claiming priority based on Korean Patent Application 10-2019-0094862 filed on Aug. 5, 2019.

TECHNICAL FIELD

The present disclosure relates to a sealing structure and a manufacturing method therefor, and more particularly, to a sealing structure having a multilayer structure including a silicon nitride and a silicon oxide, and a manufacturing method for the sealing structure.

BACKGROUND ART

An organic light emitting diode (OLED) has been used in various display devices such as smartphones and televisions because the organic light emitting diode has high color reproducibility and may be fabricated to be thin and light. However, since the organic light emitting diode is vulnerable to moisture and oxygen in the atmosphere, various sealing structures have been researched in order to prevent deterioration of the organic light emitting diode. In order for a conventional sealing structure to implement flexibility of the organic light emitting diode, the conventional sealing structure had to be as rigid as glass or as thick as a micrometer-scale thickness or more to provide a sealing characteristic. Therefore, a demand for a sealing structure having a thin thickness and a moisture permeation prevention effect to implement the flexibility of the organic light emitting diode has been increased.

Accordingly, research and development on a sealing structure having a thin thickness while preventing deterioration of an organic light emitting diode have been conducted. For example, Korean Patent Registration Publication No. 10-1372441 (Application No. 10-2011-0140975) discloses a method of forming a passivation and protection layer, capable of blocking permeation of oxygen and moisture penetrating into a polymer substrate, in which there is provided a flexible light emitting element including: a light emitting element in which a first electrode, a light emitting layer, and a second electrode are formed on a substrate; a protection film formed by sputtering a passivation thin film in which zinc or magnesium is injected into a diatomic material including one of a silicon oxide, an aluminum oxide, a titanium oxide, a magnesium oxide, a tin oxide, a zinc oxide, and a lithium nitride on the film, and laminated to a rear surface of the substrate; and a sealing layer in which a glass frit paste is applied to side surfaces of the substrate and the film.

DISCLOSURE

Technical Problem

One technical object of the present invention is to provide a sealing structure and a manufacturing method therefor.

Another technical object of the present invention is to provide a sealing structure having excellent moisture permeability and oxygen permeability, and a manufacturing method for the sealing structure.

Still another technical object of the present invention is to provide a sealing structure including a silicon nitride and a silicon oxide fabricated by plasma-enhanced atomic layer deposition, and a manufacturing method for the sealing structure.

Yet another technical object of the present invention is to provide a sealing structure having a thin thickness and manufactured by a process within a single chamber, and a manufacturing method for the sealing structure.

The technical objects of the present invention are not limited to the above-described technical objects.

Technical Solution

In order to achieve the above technical objects, the present disclosure provides a method for manufacturing a sealing structure.

According to one embodiment, the method for manufacturing the sealing structure includes: preparing a substrate in a chamber; forming a first material layer including a silicon nitride (SiNx) on the substrate; and forming a second material layer including a silicon oxide (SiOx) on the first material layer, wherein the forming of the first material layer and the forming of the second material layer are performed by plasma-enhanced atomic layer deposition (PEALD).

According to one embodiment, the forming of the first material layer may include: providing a first precursor including silicon in the chamber; purging the first precursor remaining in the chamber by using a nitrogen gas; forming the first material layer by providing a first plasma in an atmosphere in which the nitrogen gas is provided to allow the first precursor adsorbed onto the substrate to react with the nitrogen gas; and purging a residue inside the chamber by using the nitrogen gas, the providing of the first precursor, the purging of the first precursor, the forming of the first material layer, and the purging of the residue may be defined as one unit process, and the unit process may be repeatedly performed.

According to one embodiment, the forming of the second material layer may include: providing a second precursor including silicon in the chamber; purging the second precursor remaining in the chamber by using an argon gas; providing a mixed gas including the argon gas and an oxygen gas in the chamber; forming the second material layer by providing a second plasma in an atmosphere in which the mixed gas is provided to allow the second precursor adsorbed onto the substrate to react with the oxygen gas; and purging a residue inside the chamber by using the argon gas, the providing of the second precursor, the purging of the second precursor, the providing of the mixed gas, the forming of the second material layer, and the purging of the residue may be defined as one unit process, and the unit process may be repeatedly performed.

According to one embodiment, the forming of the first material layer may include providing a first plasma, the forming of the second material layer may include providing a second plasma, the first plasma may be provided under a condition of a first pressure ($P_1$), and the second plasma may be provided under a condition of a second pressure ($P_2$) that is lower than the first pressure ($P_1$).

According to one embodiment, the first plasma may be provided for a first time, and the second plasma may be provided for a second time that is shorter than the first time.

According to one embodiment, the method may further include providing a fourth plasma having an atmosphere of nitrogen ($N_2$) or ammonia ($NH_3$), after the forming of the first material layer.

According to one embodiment, the method may further include forming a third material layer including the silicon nitride (SiNx) on the second material layer, after the forming of the second material layer on the first material layer.

According to one embodiment, the method may further include providing a fifth plasma having an atmosphere of oxygen (02) and argon (Ar), after the forming of the second material layer.

According to one embodiment, the forming of the third material layer may include: providing a third precursor including silicon in the chamber; purging the third precursor remaining in the chamber by using a nitrogen gas; forming the third material layer by providing a third plasma in an atmosphere in which the nitrogen gas is provided to allow the third precursor adsorbed onto the substrate to react with the nitrogen gas; and purging a residue inside the chamber by using the nitrogen gas, the providing of the third precursor, the purging of the third precursor, the forming of the third material layer, and the purging of the residue may be defined as one unit process, the unit process may be repeatedly performed, the third plasma may be provided under a same pressure condition as the first plasma, and the third plasma may be provided for a same time as the first plasma.

In order to achieve the above technical objects, the present disclosure provides a sealing structure.

According to one embodiment, the sealing structure includes: a substrate; a first material layer including a silicon nitride (SiNx), and formed on the substrate; a second material layer including a silicon oxide (SiOx), and formed on the first material layer; and a third material layer including the silicon nitride (SiNx), and formed on the second material layer, wherein a thickness ($n_1$) of the first material layer is thicker than a thickness ($n_3$) of the third material layer.

According to one embodiment, a water vapor transmission rate (WVTR) may be $7\times10^{-4}$ g/m$^2$/day to $5\times10^{-3}$ g/m$^2$/day.

In order to achieve the above technical objects, the present disclosure provides a display device.

According to one embodiment, the display device includes: a flexible substrate; a first sealing structure formed on the flexible substrate; a selection element layer formed on the first sealing structure; an organic light emitting diode (OLED) formed on the selection element layer; a second sealing structure formed on the organic light emitting diode (OLED); and a protective glass layer formed on the second sealing structure, wherein at least one of the first sealing structure and the second sealing structure includes a sealing structure according to the present disclosure.

In order to achieve the above technical objects, the present disclosure provides a method for manufacturing a sealing structure.

According to one embodiment, the method for manufacturing the sealing structure includes: preparing a substrate in a chamber; providing a precursor including a metal in the chamber; and forming an oxide layer by providing a reaction gas to allow the precursor adsorbed onto the substrate to react with the reaction gas wherein the providing of the precursor and the providing of the reaction gas are defined as one unit process, the unit process is repeatedly performed, the precursor includes the metal including at least one of silicon, titanium, tin, or gallium, the reaction gas includes at least one of oxygen or a nitrous oxide, and a thickness of the oxide layer is greater than or equal to 60 nm.

According to one embodiment, the forming of the oxide layer may be performed by thermal atomic layer deposition (thermal ALD) or plasma-enhanced atomic layer deposition (PEALD), and, when the forming of the oxide layer is performed by the plasma-enhanced atomic layer deposition (PEALD), the forming of the oxide layer may include: providing a mixed gas including the reaction gas and an argon gas; and forming the oxide layer by providing a plasma in an atmosphere in which the mixed gas is provided to allow the precursor adsorbed onto the substrate to react with the reaction gas.

Advantageous Effects

According to an embodiment of the present invention, the method for manufacturing the sealing structure may include: preparing a substrate in a chamber; forming a first material layer including a silicon nitride on the substrate; and forming a second material layer including a silicon oxide on the first material layer.

In addition, the method for manufacturing the sealing structure may further include forming a third material layer including the silicon nitride on the second material layer.

The forming of the first material layer may include: providing a first precursor including silicon; and providing a first plasma for a predetermined time within a time during which a nitrogen gas is provided. In this case, the forming of the first material layer may be performed by using only the nitrogen gas without introducing an external gas other than the nitrogen gas. Therefore, process efficiency of the forming of the first material layer can be improved.

The forming of the second material layer may include: providing a second precursor including silicon; and providing a second plasma in an atmosphere in which a mixed gas including an inert gas and an oxygen gas is provided. In this case, the inert gas may assist ignition of the second plasma. Accordingly, the second precursor and the oxygen gas may react with each other by the second plasma, so that the second material layer can be easily formed.

By the forming of the third material layer, the sealing structure may further include the third material layer including the silicon nitride, which deteriorates by a reaction with moisture and oxygen in an atmosphere. In this case, a diffusion path of the moisture may be formed in the silicon nitride that has deteriorated. Accordingly, when compared with the sealing structure including the substrate, the first material layer formed on the substrate, and the second material layer formed on the first material layer, the diffusion path of the moisture may be extended more in the sealing structure further including the third material layer. Therefore, a sealing structure having improved moisture permeability and oxygen permeability can be provided.

DESCRIPTION OF DRAWINGS

FIG. 1 is a view for describing a process sequence of a first material layer according to an embodiment of the present invention.

FIG. 2 is a view for describing a process sequence of a second material layer according to the embodiment of the present invention.

FIG. 3 is a schematic sectional view showing a sealing structure according to a first embodiment of the present invention.

FIG. 4 is a schematic sectional view showing a sealing structure according to a second embodiment of the present invention.

FIG. 5 is a schematic sectional view showing a sealing structure including an oxide layer according to a third embodiment of the present invention.

FIG. 6 is a schematic sectional view showing a display device including a sealing structure according to an embodiment of the present invention.

FIG. 7 is a schematic view schematically showing a device for measuring a water vapor transmission rate according to an embodiment of the present invention.

FIG. 8 is a graph showing results of measuring water vapor transmission rates of the sealing structure according to the first embodiment and the sealing structure according to the second embodiment of the present invention.

FIG. 9 is a graph showing a water vapor transmission rate according to a thickness of the sealing structure according to the third embodiment of the present invention.

MODE FOR INVENTION

Hereinafter, exemplary embodiments of the present invention will be described in detail with reference to the accompanying drawings. However, the technical idea of the present invention is not limited to the embodiments described herein, but may be realized in different forms. The embodiments introduced herein are provided to sufficiently deliver the idea of the present invention to those skilled in the art so that the disclosed contents may become thorough and complete.

When it is mentioned in the present disclosure that one element is on another element, it means that one element may be directly formed on another element, or a third element may be interposed between one element and another element. Further, in the drawings, thicknesses of films and areas are exaggerated for efficient description of the technical contents.

In addition, in the various embodiments of the present disclosure, the terms such as first, second, and third are used to describe various elements, but the elements are not limited to the terms. The terms are used only to distinguish one element from another element. Therefore, an element mentioned as a first element in one embodiment may be mentioned as a second element in another embodiment. The embodiments described and illustrated herein include their complementary embodiments. Further, the term "and/or" used herein is used to include at least one of the elements enumerated before and after the term.

As used herein, the terms of a singular form may include plural forms unless the context clearly indicates otherwise. Further, the terms such as "including" and "having" are used to designate the presence of features, numbers, steps, elements, or combinations thereof described in the present disclosure, and shall not be construed to preclude any possibility of the presence or addition of one or more other features, numbers, steps, elements, or combinations thereof.

Further, in the following description of the present invention, detailed descriptions of known functions and configurations incorporated herein will be omitted when they may make the subject matter of the present invention unnecessarily unclear.

A method for manufacturing a sealing structure according to a first embodiment of the present invention will be described with reference to FIGS. 1 to 3.

FIG. 1 is a view for describing a process sequence of a first material layer according to an embodiment of the present invention, FIG. 2 is a view for describing a process sequence of a second material layer according to the embodiment of the present invention, and FIG. 3 is a schematic sectional view showing a sealing structure according to a first embodiment of the present invention.

In detail, FIG. 1(*a*) is a view for describing a unit process in a process sequence of a first material layer 110*a* according to an embodiment of the present invention, and FIG. 1(*b*) is a view for describing a unit process and a post-processing process in the process sequence of the first material layer 110*a* according to the embodiment of the present invention.

Further, in detail, FIG. 2(*a*) is a view for describing a unit process in a process sequence of a second material layer 110*b* according to the embodiment of the present invention, and FIG. 2(*b*) is a view for describing a unit process and a post-processing process in the process sequence of the second material layer 110*b* according to the embodiment of the present invention.

Referring to FIGS. 1 and 3, a substrate 100 may be prepared in a chamber. For example, the substrate 100 may be a flexible substrate. In addition, for example, the flexible substrate may be formed of polyethylene naphthalate (PEN).

The first material layer 110*a* including a silicon nitride may be formed on the substrate 100.

According to one embodiment, the forming of the first material layer 110*a* may include: providing a first precursor including silicon in the chamber; purging the first precursor remaining in the chamber by using a nitrogen gas; forming the first material layer 110*a* by providing a first plasma in an atmosphere in which the nitrogen gas is provided to allow the first precursor adsorbed onto the substrate 100 to react with the nitrogen gas; and purging a residue inside the chamber by using the nitrogen gas.

The providing of the first precursor may include adsorbing the first precursor onto the substrate 100. For example, the first precursor may be provided for 0.1 second.

According to one embodiment, the first precursor may be at least one of diisopropylamino silane (DIPAS) having a structure of <Chemical Formula 1>, bis(t-butylamino)silane (BTBAS) having a structure of <Chemical Formula 2>, bis(diethylamino)silane (BDEAS) having a structure of <Chemical Formula 3>, or tris(dimethylamino)silane (TDMAS) having a structure of <Chemical Formula 4>.

<Chemical Formula 1>

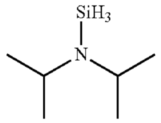

<Chemical Formula 2>

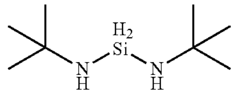

<Chemical Formula 3>

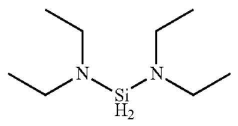

<Chemical Formula 4>

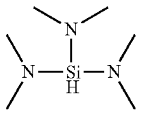

In general, it is known that, as compared with the second material layer 110*b*, the first material layer 110*a* further includes impurities such as carbon atoms when fabricated at a lower temperature. Accordingly, the first material layer 110*a* may be fabricated more easily by using the bis(t- butylamino)silane (BTBAS) than using the diisopropylamino silane (DIPAS) as the first precursor.

The purging of the first precursor may include removing the first precursor remaining without being adsorbed onto the substrate 100 from an inside of the chamber by providing the nitrogen gas. For example, the nitrogen gas may be provided for 15 seconds.

The forming of the first material layer 110*a* may include providing the first plasma while the nitrogen gas is provided. Accordingly, the first material layer 110*a* may be formed. In this case, an energetically excited nitrogen radical may be generated from the nitrogen gas, and the first precursor adsorbed onto the substrate 100 may react with the nitrogen radical to form the silicon nitride. In addition, for example, the first plasma may be provided for 10 seconds, and provided under a pressure condition of 0.8 Torr.

Unlike the above configuration, when the first plasma is applied while a gas including nitrogen atoms other than the nitrogen gas, for example, an ammonia gas is provided, an ammonia radical generated by the first plasma may have a lower reactivity with the first precursor than the nitrogen radical. Therefore, the first material layer 110*a* may not be easily formed.

However, as described above, when the first plasma is applied while the nitrogen gas is provided, the first material layer 110*a* may be easily formed.

The purging of the residue may include removing the residue of the diisopropylamino silane (DIPAS) decomposed by the reaction of the first precursor with the nitrogen radical from the inside of the chamber while the nitrogen gas is provided. For example, the nitrogen gas may be provided for 5 seconds.

The providing of the first precursor, the purging of the first precursor, the forming of the first material layer 110*a*, and the purging of the residue may be defined as one unit process, and the unit process may be repeatedly performed. For example, the unit process may be performed at 100° C.

According to the embodiment of the present invention, the purging of the first precursor, the forming of the first material layer 110*a*, and the purging of the residue may be performed under the same gas atmosphere, and the gas atmosphere may be a nitrogen gas atmosphere. In other words, after the providing of the first precursor, the nitrogen gas may be continuously provided, and the first plasma may be provided for the predetermined time within the time during which the nitrogen gas is provided. Accordingly, the forming of the first material layer 110*a* may be performed without providing an external gas other than the nitrogen gas, so that process efficiency may be improved. For example, the external gas may be an argon gas.

Unlike the above configuration, when the first plasma is provided in a mixed gas atmosphere including the nitrogen gas and the external gas in the forming of the first material layer 110*a*, deposition uniformity of the fabricated first material layer 110*a* may be reduced, and a refractive index of the first material layer 110*a* may be reduced.

However, according to the embodiment of the present invention, when the first plasma is provided in the nitrogen atmosphere without the external gas, efficiency of the process of forming the first material layer 110*a* may be improved, and stability of the first material layer 110*a* may be increased.

According to one modified example, as shown in FIG. 1(*b*), the method may further include post-processing the first material layer 110*a*, after the forming of the first material layer 110*a*.

The post-processing of the first material layer 110*a* may include providing a fourth plasma in an atmosphere of nitrogen ($N_2$) or ammonia ($NH_3$).

As will be described below, after the first material layer 110*a* is formed, the second material layer 110*b* may be formed on the first material layer 110*a*. Accordingly, in order to improve interfacial stability between the first material layer 110*a* and the second material layer 110*b*, the fourth plasma may be provided on the first material layer 110*a*.

For example, before the forming of the second material layer 110*b*, the fourth plasma may be provided on the first material layer 110*a*, so that bonding strength between silicon (Si) and nitrogen (N) of the first material layer 110*a* including the silicon nitride may be enhanced. Accordingly, a surface of the first material layer 110*a* may be modified, and the interfacial stability between the first material layer 110*a* and the second material layer 110*b* may be improved.

Referring to FIGS. 2 and 3, the second material layer 110*b* including a silicon oxide (SiOx) may be formed on the first material layer 110*a* including the silicon nitride.

According to one embodiment, the forming of the second material layer 110*b* may include: providing a second precursor including silicon in the chamber; purging the second precursor remaining in the chamber by using an inert gas; providing a mixed gas including the inert gas and an oxygen gas in the chamber; forming the second material layer 110*b* by providing a second plasma in an atmosphere in which the mixed gas is provided to allow the second precursor adsorbed onto the substrate 100 to react with the oxygen gas; and purging a residue inside the chamber by using the inert gas. For example, the inert gas may be an argon gas.

The providing of the second precursor may include adsorbing the second precursor onto the first material layer 110*a*. For example, the second precursor may be provided for 0.1 second.

According to one embodiment, the second precursor may be at least one of diisopropylamino silane (DIPAS) having the structure of <Chemical Formula 1>, bis(t-butylamino) silane (BTBAS) having the structure of <Chemical Formula 2>, bis(diethylamino)silane (BDEAS) having the structure of <Chemical Formula 3>, or tris(dimethylamino)silane (TDMAS) having the structure of <Chemical Formula 4>.

The purging of the second precursor may include removing the second precursor remaining without being adsorbed onto the first material layer 110*a* from the inside of the chamber by providing the inert gas. For example, the inert gas may be provided for 15 seconds.

The providing of the mixed gas may include providing the mixed gas in which the inert gas and the oxygen gas are mixed with each other by providing the oxygen gas while the inert gas is provided.

According to the embodiment of the present invention, the providing of the mixed gas may be performed before purging the first precursor and providing the second plasma. In other words, before providing the second plasma, the mixed gas may be provided for a predetermined time. Accordingly, the gas atmosphere inside the chamber may be changed from the inert gas into the mixed gas. Therefore, before the forming of the second material layer 110*b*, the mixed gas may be provided in the chamber at a high density.

Unlike the above configuration, when the second plasma is provided simultaneously with the mixed gas immediately after the purging of the first precursor without the providing of the mixed gas, the density of the mixed gas may not be high in the chamber. Accordingly, as will be described below, an oxygen radical having a high density may not be formed in the providing of the second plasma. Therefore, it may not be easy to form the second material layer 110*b* within a short time.

Therefore, according to the embodiment of the present invention, the second material layer 110*b* may be easily formed by providing the mixed gas for the predetermined time before providing the second plasma.

The forming of the second material layer 110*b* may include providing the second plasma while the mixed gas is provided. Accordingly, the second material layer 110*b* may be formed. In this case, an energetically excited oxygen radical may be generated from the oxygen gas of the mixed gas, and the second precursor adsorbed onto the substrate 100 may react with the oxygen radical to form the second material layer 110*b*. In addition, for example, the second plasma may be provided for 2 seconds, and provided under a pressure condition of 0.6 Torr.

In this case, reactivity of the second precursor with the oxygen radical may be higher than the reactivity of the first precursor with the nitrogen radical described above with reference to FIG. 1. Accordingly, the first plasma forming the first material layer 110*a* may have a higher density than the second plasma forming the second material layer 110*b*. In other words, the first plasma may be provided at a higher pressure and for a longer time as compared with the second plasma.

Therefore, when the first plasma is provided under a condition of a first pressure $P_1$, the second plasma may be provided under a condition of a second pressure $P_2$ that is lower than the first pressure $P_1$. For example, the condition of the first pressure $P_1$ may be 0.8 Torr, and the condition of the second pressure $P_2$ may be 0.6 Torr.

In addition, when the first plasma is provided for a first time, the second plasma may be provided for a second time that is shorter than the first time. For example, the first time may be 10 seconds, and the second time may be 2 seconds.

According to the embodiment of the present invention, the forming of the second material layer 110*b* may include providing the mixed gas including the argon gas, which is a gas other than the oxygen gas, in addition to the oxygen gas, which is a reaction gas to which the second plasma is applied to generate a radical.

Unlike the above configuration, when only the oxygen gas is provided in the forming of the second material layer 110*b*, the reactivity between the oxygen radical and the second precursor may be reduced as compared with the case of the mixed gas. Accordingly, pressures of the second plasma and the oxygen gas may have to be increased, and an application time of the second plasma may become longer.

However, according to the embodiment of the present invention, when the mixed gas is provided, the argon gas may assist ignition of the second plasma. Accordingly, the pressure and the time for which the second plasma is provided may be reduced, and stability of the second material layer 110*b* fabricated as described above may be improved.

The purging of the residue may include removing the residue of the diisopropylamino silane (DIPAS) decomposed by the reaction of the second precursor with the oxygen radical from the inside of the chamber while the argon gas is provided. For example, the argon gas may be provided for 5 seconds.

The providing of the second precursor, the purging of the second precursor, the providing of the mixed gas, the forming of the second material layer 110*b*, and the purging of the residue may be defined as one unit process, and the unit process may be repeatedly performed. For example, the unit process may be performed at the same process temperature as the forming of the first material layer 110*a* described above with reference to FIG. 1.

As described above, as shown in FIG. 3, the sealing structure including the substrate 100, the first material layer 110*a* including the silicon nitride and formed on the substrate 100, and the second material layer 110*b* including the silicon oxide and formed on the first material layer 110*a* may be formed.

Unlike the above configuration, when the first material layer 110*a* is formed on the second material layer 110*b*, or when the second material layer 110*b* is omitted, the first material layer 110*a* may be located on a surface. In other words, the silicon nitride may be located on the surface of the sealing structure.

In this case, bonding strength between silicon (Si) and nitrogen (N) of the silicon nitride may be weaker than bonding strength between silicon (Si) and oxygen (O) of the silicon oxide. Accordingly, the silicon nitride may easily react with moisture and oxygen in the atmosphere as compared with the silicon oxide. Accordingly, the silicon nitride may be oxidized, so that a sealing characteristic against the moisture and the oxygen may deteriorate.

However, according to the embodiment of the present invention, the first material layer 110*a* may be provided between the substrate 100 and the second material layer 110*b*, so that an effect of preventing moisture permeation and oxygen permeation of the sealing structure including the substrate 100, the first material layer 110*a*, and the second material layer 110*b* may be improved.

A method for manufacturing a sealing structure according to a second embodiment of the present invention will be described with reference to FIGS. 1 to 4.

FIG. 4 is a schematic sectional view showing a sealing structure according to a second embodiment of the present invention.

Referring to FIG. 4, a third material layer 110*c* including the silicon nitride (SiNx) may be further formed on the second material layer 110*b* including the silicon oxide described above with reference to FIG. 3.

Therefore, according to one modified example, as shown in FIG. 2(*b*), the method may further include post-processing the second material layer 110*b*, after the forming of the second material layer 110*b*.

The post-processing of the second material layer 110*b* may include providing a fifth plasma in an atmosphere of oxygen (02) and the inert gas.

As described above, after the second material layer 110*b* is formed, the third material layer 110*c* may be further formed on the second material layer 110*b*. In this case, the fifth plasma may be provided on the second material layer 110*b*, so that a surface of the second material layer 110*b* may be modified. Accordingly, interfacial stability between the second material layer 110*b* and the third material layer 110*c* may be improved.

According to one embodiment, the forming of the third material layer 110*c* may include: providing a third precursor including silicon in the chamber; purging the third precursor remaining in the chamber by using a nitrogen gas; forming the third material layer 110*c* by providing a third plasma in an atmosphere in which the nitrogen gas is provided to allow the third precursor adsorbed onto the substrate 100 to react with the nitrogen gas; and purging a residue inside the chamber by using the nitrogen gas.

The providing of the third precursor, the purging of the third precursor, the forming of the third material layer 110*c*, and the purging of the residue may be defined as one unit process, and the unit process may be repeatedly performed. For example, the unit process may be performed at the same process temperature as the forming of the first material layer 110*a* described above with reference to FIG. 1.

According to the embodiment of the present invention, the forming of the third material layer 110*c* may be performed by repeatedly performing the same unit process as the forming of the first material layer 110*a* described above with reference to FIG. 1, while numbers of repetitions of the unit process in the first material layer 110*a* and the third material layer 110*c* may be different from each other. In other words, thicknesses of the first material layer 110*a* and the third material layer 110*c* fabricated by repeatedly performing the unit process may be different from each other.

For example, as shown in FIG. 4(*b*), a thickness $n_1$ of the first material layer 110*a* may be different from a thickness $n_3$ of the third material layer 110*c*. In this case, the thickness $n_3$ of the third material layer 110*c* may be thinner than the thickness $n_1$ of the first material layer 110*a*.

Alternatively, as another example, as shown in FIG. 4(*a*), the thickness $n_1$ of the first material layer 110*a* and the thickness $n_3$ of the third material layer 110*c* may be equal to each other.

The second material layer 110*b* may be formed immediately after the forming of the first material layer 110*a*, so that an interface may be formed between the first material layer 110*a* and the second material layer 110*b* formed on the first material layer 110*a* and including a material different from a material of the first material layer 110*a*. Meanwhile, the third material layer 110*c* may be located on the surface of the sealing structure.

Therefore, during the forming of the second material layer 110*b*, the thickness of the first material layer 110*a* may be thicker than the thickness of the third material layer 110*c* in order to stably maintain the interface. Accordingly, as described above with reference to FIG. 1, in order to improve stability of the interface, the method may further include providing a fourth plasma on the first material layer 110*a* immediately after the first material layer 110*a* is formed.

In addition, the third material layer 110*c* located on the surface of the sealing structure may be exposed to the atmosphere to react with the oxygen and the moisture in the atmosphere. Accordingly, the third material layer 110*c* may deteriorate, so that an oxide may be formed on at least a portion of the surface. Therefore, the oxide may prevent diffusion of the oxygen and the moisture into the sealing structure.

As described above, as shown in FIG. 4, the sealing structure including the substrate 100, the first material layer 110*a* including the silicon nitride and formed on the substrate 100, the second material layer 110*b* including the silicon oxide and formed on the first material layer 110*a*, and the third material layer 110*c* including the silicon nitride and formed on the second material layer 110*b* may be formed.

In this case, when compared with the sealing structure according to the first embodiment of the present invention described above with reference to FIGS. 1 to 3, the sealing structure may further include the third material layer 110*c*. Accordingly, the sealing structure may further include the third material layer 110*c* including the silicon nitride.

In this case, when compared with the silicon oxide, the silicon nitride may easily deteriorate by a reaction with the moisture and the oxygen in the atmosphere. Accordingly, a moisture diffusion path may be formed in the silicon nitride. In this case, when compared with the sealing structure according to the first embodiment of the present invention, the sealing structure further includes the silicon nitride, so that the moisture diffusion path may be extended, resulting in a lower water vapor transmission rate.

The sealing structure according to the first embodiment and the sealing structure according to the second embodiment of the present invention may be used in a display device to prevent moisture permeation.

For example, the display device may include a flexible substrate, a first sealing structure formed on the flexible substrate, a transistor (TFT) formed on the first sealing structure, an organic light emitting diode (OLED) formed on the transistor (TFT), a second sealing structure formed on the organic light emitting diode (OLED), and a protective glass layer formed on the second sealing structure. In this case, at least one of the first sealing structure and the second sealing structure may include the sealing structure according to the first embodiment and the sealing structure according to the second embodiment of the present invention.

In addition, the sealing structure according to the first embodiment and the sealing structure according to the second embodiment of the present invention may have a water vapor transmission rate (WVTR) within a range of $7\times10^{-4}$ g/m$^2$/day to $5\times10^{-3}$ g/m$^2$/day.

Unlike the embodiment of the present invention, in a case of a sealing structure including a single film formed of a silicon nitride, as described above with reference to FIGS. 1 to 4, the silicon nitride may easily react with the moisture and the oxygen in the atmosphere. Accordingly, the silicon nitride may deteriorate, resulting in a high water vapor transmission rate.

In addition, unlike the embodiment of the present invention, in a case of a sealing structure including a single film formed of a silicon oxide, as described above with reference to FIGS. 1 to 4, the silicon oxide may be more stable to the moisture and the oxygen than the silicon nitride. However, when the silicon oxide has a thin thickness, the sealing structure may have a higher water vapor transmission rate than a sealing structure having a stacked structure, including a material that is different from the silicon oxide, and having the same thickness. As described above with reference to FIG. 4, when the different material is a silicon nitride, a moisture diffusion path may be formed in the silicon nitride due to moisture permeability of the silicon nitride. In addition, formation of defects at an interface with the different material may be minimized. Therefore, the sealing structure including the single film formed of the silicon oxide may have a higher water vapor transmission rate than the embodiment of the present invention.

Therefore, the sealing structure including the silicon oxide and the silicon nitride manufactured as described above may have a superior moisture permeation prevention characteristic than the sealing structure including the single film formed of the silicon oxide or the silicon nitride and having the same thickness.

A method for manufacturing a sealing structure including an oxide layer 210 according to a third embodiment of the present invention will be described with reference to FIG. 5.

FIG. 5 is a schematic sectional view showing a sealing structure including an oxide layer 210 according to a third embodiment of the present invention.

Referring to FIG. 5, a sealing structure including a substrate 200 and an oxide layer 210 formed on the substrate 200 may be formed.

According to one embodiment, the substrate 200 may be prepared in a chamber. The substrate 200 may be a flexible substrate. In addition, for example, the flexible substrate may be formed of polyethylene naphthalate (PEN).

According to one embodiment, a precursor including a metal may be provided in the chamber. The precursor may include the metal including at least one of silicon, titanium, tin, or gallium.

According to one embodiment, the oxide layer 210 may be formed by providing a reaction gas to allow the precursor adsorbed onto the substrate 200 to react with the reaction gas. The reaction gas may be at least one of oxygen or a nitrous oxide.

For example, when the forming of the oxide layer 210 is performed by thermal atomic layer deposition (thermal ALD), an inside of the chamber may be heated by a heat source. In this case, the reaction gas may obtain thermal energy by heating, so that the precursor and the reaction gas may react with each other, and thus the oxide layer 210 may be formed.

As another example, when the forming of the oxide layer 210 is performed by plasma-enhanced atomic layer deposition (PEALD), the forming of the oxide layer 210 may include: providing a mixed gas including the reaction gas and an argon gas; and forming the oxide layer 210 by providing a plasma in an atmosphere in which the mixed gas is provided to allow the precursor adsorbed onto the substrate 200 to react with the reaction gas.

As described above with reference to FIGS. 2 and 3, the providing of the mixed gas may include providing the mixed gas for a predetermined time before providing the plasma. Accordingly, before the oxide layer 210 is formed, the mixed gas may be provided in the chamber at a high density.

In addition, the forming of the oxide layer 210 may include providing the plasma while the mixed gas is provided. Accordingly, the oxide layer 210 may be formed. In this case, as described above with reference to FIGS. 1 and 3, an energetically excited oxygen radical may be generated from the oxygen gas of the mixed gas by the plasma, so that the oxygen radical and the precursor may react with each other to form the oxide layer 210.

The providing of the precursor and the forming of the oxide layer 210 may be defined as one unit process, and the unit process may be repeatedly performed.

According to one embodiment, when a thickness of the oxide layer 210 is less than 60 nm, a water vapor transmission rate may be high. Meanwhile, when the thickness of the oxide layer 210 is greater than or equal to 60 nm, the water vapor transmission rate may be low, and a degree of a decrease in the water vapor transmission rate according to an increase of the thickness may be reduced. Therefore, the thickness of the oxide layer 210 may be greater than or equal to 60 nm.

As shown in FIG. 5, the sealing structure including the substrate 200 and the oxide layer 210 formed on the substrate 200 may be formed. In this case, the oxide layer 210 fabricated as described above may be formed of one of a silicon oxide ($SiO_2$), a tin oxide (SnOx), a titanium oxide ($TiO_2$), and a gallium oxide (GaOx).

FIG. 6 is a schematic sectional view showing a display device including a sealing structure according to an embodiment of the present invention.

Referring to FIG. 6, the display device may include a flexible substrate 300, a first sealing structure 310 formed on the flexible substrate 300, a selection element layer 320 formed on the first sealing structure 310, an organic light emitting diode 330 formed on the selection element layer 320, a second sealing structure 340 formed on the organic light emitting diode 330, and a protective glass layer 350 formed on the second sealing structure 340. In this case, at least one of the first sealing structure 310 and the second sealing structure 340 may include the sealing structure according to the first embodiment, the sealing structure according to the second embodiment, or the sealing structure according to the third embodiment of the present invention. For example, the selection element layer may include a transistor.

The organic light emitting diode 330 may have a structure in which an organic material layer is stacked on a substrate, and may be a device for receiving electrical energy to emit light. In this case, since the stacked organic material layer is very thin to have a thickness of several hundred nanometers, the organic light emitting diode 330 may be thin and flexible. However, since the organic light emitting diode 330 is vulnerable to the moisture and the oxygen in the atmosphere, the organic light emitting diode 330 may easily deteriorate when left in the atmosphere. Accordingly, in order to prevent the moisture and the oxygen from being introduced into the organic light emitting diode 330, the first sealing structure 310 and the second sealing structure 340 may be provided under and above the organic light emitting diode 330, respectively.

In this case, as described above with reference to FIGS. 1 to 4, the sealing structure according to the embodiment of the present invention may be configured such that the substrate 100 is the flexible substrate. Accordingly, flexibility of the organic light emitting diode 330 may be maintained.

Meanwhile, unlike the embodiment of the present invention, as described above with reference to FIGS. 1 to 4, a sealing structure including the substrate 100 and a single film formed on the substrate 100 by using one of the silicon nitride and the silicon oxide may deteriorate by the moisture and the oxygen in the atmosphere. Therefore, the sealing structure including the single film may not be easily used as the sealing structure of the display device.

In addition, unlike the sealing structure according to the embodiment of the present invention described above, a conventional sealing structure including a material layer formed of at least one of the silicon oxide or the silicon nitride, which is fabricated by plasma-enhanced chemical vapor deposition (PECVD), may be manufactured on a micrometer scale. In this case, when the flexible substrate is used as the substrate, stress may be caused between the material layer and the substrate, so that the material layer may be peeled off from the substrate. Therefore, the sealing structure manufactured by the plasma-enhanced chemical vapor deposition (PECVD) may not be easily used as the sealing structure of the display device.

Therefore, the sealing structure according to the embodiment of the present invention may include a flexible substrate as the substrate 100. Accordingly, the sealing structure may maintain thin and flexible advantages of the organic light emitting diode 330. In addition, the sealing structure may have a low water vapor transmission rate, so that the sealing structure may be provided as the sealing structure of the display device including the organic light emitting diode 330.

FIG. 7 is a schematic view schematically showing a device for measuring a water vapor transmission rate according to an embodiment of the present invention. In detail, FIG. 7(*a*) is a top view showing the device for measuring the water vapor transmission rate, and FIG. 7(*b*) is a side view of the device for measuring the water vapor transmission rate.

Referring to FIG. 7, a sample may be provided inside a thermo-hygrostat. The sample may be fabricated by depositing a titanium/aluminum electrode 440 on a glass substrate 460, forming a calcium thin film 420 making contact with the electrode 440, fabricating an epoxy resin 430 surrounding the calcium thin film 420 in a vertical direction on the electrode 440, and providing a sealing structure 410 making contact with the epoxy resin 430. For example, the thermo-hygrostat may be maintained at a temperature of 25° C. and a relative humidity of 50%.

In other words, the sealing structure 410 may be provided in an upper portion of the calcium thin film 420, the epoxy resin 430 may be provided on a lateral side of the calcium thin film 420, and the glass substrate 460 may be provided in a lower portion of the calcium thin film 420. Accordingly, the calcium thin film 420 may be surrounded by the sealing structure 410, the epoxy resin 430, and the glass substrate 460.

In this case, a current may be applied to the calcium thin film 420 through the electrode 440 making contact with the calcium thin film 420 every predetermined time. Accordingly, the calcium thin film 420 may be oxidized, and simultaneously, a resistance may be generated in the calcium thin film 420. A time at which the calcium thin film 420 is completely oxidized may be measured, so that a water vapor transmission rate of the sealing structure 410 may be calculated. In this case, the resistance may be measured by a resistance measurement probe 450 making contact with the electrode 440.

Hereinafter, specific manufacturing methods and characteristic evaluation results of the sealing structure according to the first embodiment and the sealing structure according to the second embodiment of the present invention described above will be described.

Manufacture of Sealing Structure According to Example 1

Polyethylene naphthalate (PEN) having a thickness of 125 um was prepared as a substrate, and diisopropylamino silane (DIPAS) was prepared as a precursor.

After the substrate is loaded into a chamber, the precursor was introduced into the chamber for 0.1 second. Thereafter, a nitrogen gas ($N_2$) was injected at a pressure of 0.8 Torr. In this case, purging for 15 seconds, plasma application for 10 seconds, and purging for 5 seconds were performed. In other words, a process cycle of precursor for 0.1 second→nitrogen purging for 15 seconds→nitrogen plasma for 10 seconds→nitrogen purging for 5 seconds was performed. The process cycle was repeatedly performed to fabricate a silicon nitride having a thickness of 30 nm.

Next, the precursor was introduced into the chamber for 0.1 second. An argon gas (Ar) was injected at a pressure of 0.4 Torr to perform purging. A mixed gas obtained by adding an oxygen gas ($O_2$) to the argon gas was injected at a pressure of 0.6 Torr. In this case, after the mixed gas is provided for 3 seconds, a plasma was applied for 2 seconds in an atmosphere of the mixed gas. Again, the argon gas was injected at 0.4 Torr to perform purging. In other words, a process cycle of precursor for 0.1 second→argon purging for 15 seconds→argon/oxygen for 3 seconds→argon/oxygen plasma for 2 seconds→argon purging for 5 seconds was performed. The process cycle was repeatedly performed to fabricate a silicon oxide having a thickness of 30 nm.

Therefore, a sealing structure according to Example 1 of the present invention, which includes substrate/30 nm silicon nitride/30 nm silicon oxide, was manufactured.

Manufacture of Sealing Structure According to Example 2

A sealing structure was manufactured in the same manner as the method for manufacturing the sealing structure according to the first embodiment described above, while the process cycle of the silicon nitride was repeatedly performed to fabricate the silicon nitride having a thickness of 20 nm on the substrate. Thereafter, the process cycle of the silicon oxide was repeatedly performed to fabricate the silicon oxide having a thickness of 20 nm on the silicon nitride. Again, the process cycle of the silicon nitride was repeatedly performed to fabricate the silicon nitride having a thickness of 20 nm on the silicon oxide.

Therefore, a sealing structure according to Example 2 of the present invention, which includes substrate/20 nm silicon nitride/20 nm silicon oxide/20 nm silicon nitride, was manufactured.

Manufacture of Sealing Structure According to Comparative Example 1

Polyethylene naphthalate (PEN) having a thickness of 125 um was prepared to manufacture a sealing structure according to Comparative Example 1 of the present invention.

Manufacture of Sealing Structure According to Comparative Example 2

A sealing structure was manufactured in the same manner as the method for manufacturing the sealing structure according to the first embodiment described above, while the process cycle of the silicon oxide was repeatedly performed to fabricate the silicon oxide having a thickness of 60 nm on the substrate.

Therefore, a sealing structure according to Comparative Example 2 of the present invention, which includes substrate/60 nm silicon oxide, was manufactured.

Manufacture of Sealing Structure According to Comparative Example 3

A sealing structure was manufactured in the same manner as the method for manufacturing the sealing structure according to the first embodiment described above, while the process cycle of the silicon nitride was repeatedly performed to fabricate the silicon nitride having a thickness of 60 nm on the substrate.

Therefore, a sealing structure according to Comparative Example 3 of the present invention, which includes substrate/60 nm silicon nitride, was manufactured.

Manufacture of Sealing Structure According to Comparative Example 4

A sealing structure was manufactured in the same manner as the method for manufacturing the sealing structure according to the first embodiment described above, while the process cycle of the silicon oxide was repeatedly performed to fabricate the silicon oxide having a thickness of 30 nm on the substrate. Thereafter, the process cycle of the silicon nitride was repeatedly performed to fabricate the silicon nitride having a thickness of 30 nm on the silicon nitride.

Therefore, a sealing structure according to Comparative Example 4 of the present invention, which includes substrate/30 nm silicon oxide/30 nm silicon nitride, was manufactured.

Manufacture of Sealing Structure According to Comparative Example 5

A sealing structure was manufactured in the same manner as the method for manufacturing the sealing structure according to the first embodiment described above, while the process cycle of the silicon nitride was repeatedly performed to fabricate the silicon nitride having a thickness of 15 nm on the substrate. Thereafter, the process cycle of the silicon oxide was repeatedly performed to fabricate the silicon oxide having a thickness of 15 nm. Again, the process cycles of the silicon nitride and the silicon oxide were repeatedly performed to fabricate the silicon nitride and the silicon oxide, each having a thickness of 15 nm, respectively.

Therefore, a sealing structure according to Comparative Example 5 of the present invention, which includes substrate/15 nm silicon nitride/15 nm silicon oxide/15 nm silicon nitride/15 nm silicon oxide, was manufactured.

Structures of the sealing structures according to Examples 1 and 2 and Comparative Examples 1 to 5 of the present invention manufactured as described above were listed in <Table 1>.

TABLE 1

| | Structure of Sealing Structure |
|---|---|
| Example 1 | PEN/30 nm SiNx/30 nm SiOx |
| Example 2 | PEN/20 nm SiNx/20 nm SiOx/20 nm SiNx |
| Comparative Example 1 | PEN |
| Comparative Example 2 | PEN/60 nm SiOx |
| Comparative Example 3 | PEN/60 nm SiNx |
| Comparative Example 4 | PEN/30 nm SiOx/30 nm SiNx |
| Comparative Example 5 | PEN/15 nm SiNx/15 nm SiOx/ 15 nm SiNx/15 nm SiOx |

FIG. 8 is a graph showing results of measuring water vapor transmission rates of the sealing structure according to the first embodiment and the sealing structure according to the second embodiment of the present invention.

Referring to FIG. 8, a complete oxidation time of the calcium thin film and a water vapor transmission rate calculated by the complete oxidation time were listed in <Table 2> according to a type of the sealing structure provided in the device for measuring the water vapor transmission rate described above with reference to FIG. 7.

TABLE 2

| | Complete Oxidation Time of Calcium Thin Film (hr) | Water Vapor Transmission Rate ($g/m^2$/day) |
|---|---|---|
| Example 1 | 220.2 | $5.16 \times 10^{-3}$ |
| Example 2 | 1543.7 | $7.36 \times 10^{-4}$ |
| Comparative Example 1 | 18.6 | $1.10 \times 10^{-1}$ |
| Comparative Example 2 | 45.2 | $2.51 \times 10^{-2}$ |
| Comparative Example 3 | 32.0 | $3.55 \times 10^{-2}$ |
| Comparative Example 4 | 27.0 | $4.20 \times 10^{-2}$ |

As shown in FIG. 8 and <Table 2>, when compared with the sealing structure including only the substrate (Comparative Example 1), in a case of a sealing structure including the substrate and the material layer formed on the substrate and selected from one of a silicon nitride and a silicon oxide, the calcium thin film was completely oxidized more slowly, so that a water vapor transmission rate was calculated to be lower.

In this case, when the material layer is a single film in the sealing structure including the material layer, the sealing structure including a single film formed of the silicon oxide (Comparative Example 2) exhibited a lower water vapor transmission rate than the sealing structure including a single film formed of the silicon nitride (Comparative Example 3). Accordingly, as described above with reference to FIGS. 1 to 4, it was found that the silicon nitride has lower stability than the silicon oxide in the atmosphere so as to easily deteriorate.

In addition, in a case of a sealing structure including a stacked structure of the silicon nitride and the silicon oxide as the material layer, in which the stacked structure includes two layers, a water vapor transmission rate was calculated to be lower in the sealing structure including the silicon oxide on a surface (Example 1) than in the sealing structure including the silicon nitride on the surface (Comparative Example 4). In other words, as described above with reference to FIGS. 1 to 4, when compared with the sealing structure according to Comparative Example 4 of the present invention, the sealing structure according to Example 1 may be easily used as a moisture permeation prevention film of the display device or the like.

In this case, the sealing structure according to Example 1 of the present invention may further include the silicon nitride on the surface. Accordingly, the sealing structure manufactured thereby may be defined as the sealing structure according to Example 2. In this case, as described above with reference to FIGS. 1 to 4, a diffusion path of the moisture formed in the silicon nitride may be extended, so that the sealing structure according to Example 2 may exhibit a lower water vapor transmission rate than the sealing structure according to Example 1 of the present invention.

Meanwhile, a sealing structure may have the same thickness as the sealing structure according to Example 2 of the present invention, while the sealing structure may further include the silicon oxide on the surface of the sealing structure. Accordingly, the sealing structure manufactured thereby may be defined as the sealing structure according to Comparative Example 5. In this case, the sealing structure exhibited a behavior that is similar to a behavior of the sealing structure according to Comparative Example 1. As described above, the sealing structure included the silicon oxide having higher stability than the silicon nitride on the surface. However, the thickness of the silicon nitride was reduced, and the moisture permeation prevention characteristic of the sealing structure deteriorated. Accordingly, it was found that the moisture permeation prevention characteristic of the sealing structure is adjusted according to the thickness of the silicon nitride. Therefore, when the thickness of the silicon nitride film is about 20 nm as in the sealing structure according to Example 2 of the present invention, the moisture permeation prevention characteristic of the sealing structure may be easily exhibited.

Hereinafter, a specific manufacturing method and a characteristic evaluation result of the sealing structure according to the third embodiment of the present invention described above will be described.

Manufacture of Sealing Structure According to Experimental Example 1 (plasma TiO2)

Polyethylene naphthalate (PEN) having a thickness of 125 um was prepared as a substrate, and titanium isopropoxide (TTIP) was prepared as a precursor.

After the substrate is loaded into a chamber, a process cycle of precursor (TTIP) introduction for 1 second→argon purging for 25 seconds (0.4 Torr)→argon/oxygen introduction for 4 seconds (0.6 Torr)→argon/oxygen plasma for 10 seconds (0.6 Torr)→argon purging for 10 seconds (0.4 Torr) was performed. The process cycle was repeatedly performed, and a titanium oxide of 10 to 120 nm was fabricated on the substrate, so that a sealing structure according to Experimental Example 1 of the present invention (plasma $TiO_2$) was manufactured.

Manufacture of Sealing Structure According to Experimental Example 2 (Plasma SiO2)

A sealing structure was manufactured in the same manner as the method for manufacturing the sealing structure according to Experimental Example 1 described above, while the precursor was changed from the titanium isopropoxide (TTIP) into diisopropylamino silane (DIPAS), so that a sealing structure according to Experimental Example 2 of the present invention (plasma $SiO_2$), which includes a silicon oxide of 10 to 120 nm formed on the substrate, was manufactured.

Manufacture of Sealing Structure According to Experimental Example 3 (Thermal SnOx)

Polyethylene naphthalate (PEN) having a thickness of 125 um was prepared as a substrate, and tetrakis-dimethylamino tin (TDMASn) was prepared as a precursor.

After the substrate is loaded into a chamber, under a temperature condition of 100° C., a process cycle of precursor (TDMASn) introduction for 1 second→argon purging for 25 seconds (0.4 Torr)→oxygen gas injection for 4 seconds (0.6 Torr)→argon purging for 10 seconds (0.4 Torr) was performed. The process cycle was repeatedly performed, and a tin oxide of 10 to 120 nm was fabricated on the substrate, so that a sealing structure according to Experimental Example 3 of the present invention (thermal SnOx) was manufactured.

Manufacture of Sealing Structure According to Experimental Example 4 (Plasma GaOx)

A sealing structure was manufactured in the same manner as the method for manufacturing the sealing structure according to Experimental Example 1 described above, while the precursor was changed from the titanium isopropoxide (TTIP) into trimethyl gallium (TMGa), so that a sealing structure according to Experimental Example 4 of the present invention (plasma $GaO_2$), which includes a gallium oxide of 10 to 120 nm formed on the substrate, was manufactured.

FIG. 9 is a graph showing a water vapor transmission rate according to a thickness of the sealing structure according to the third embodiment of the present invention.

Referring to FIG. 9, a water vapor transmission rate according to a thickness of the sealing structure according to the third embodiment of the present invention may be found as compared with the conventional sealing structure including the silicon oxide fabricated by the plasma-enhanced chemical vapor deposition (PECVD).

As shown in FIG. 9, the water vapor transmission rate of the sealing structure according to the third embodiment of the present invention was observed to be about 10 times lower than the water vapor transmission rate of the conventional sealing structure.

In addition, as the thickness of the oxide layer increases, the water vapor transmission rate was decreased. At this point, when the thickness of the oxide layer is greater than or equal to 60 nm, a decrease in the water vapor transmission rate according to the thickness was reduced. In this case, the titanium oxide fabricated by the plasma-enhanced atomic layer deposition (PEALD) exhibited the lowest water vapor transmission rate.

Although the exemplary embodiments of the present invention have been described in detail, the scope of the present invention is not limited to a specific embodiment, and should be interpreted by the appended claims. In addition, it should be understood by those of ordinary skill in the art that various changes and modifications can be made without departing from the scope of the present invention.

INDUSTRIAL APPLICABILITY

The sealing structure according to the embodiment of the present invention may be used in various industrial fields such as a display, a memory, a logic IC, and a sensor.

The invention claimed is:

1. A method for manufacturing a sealing structure, the method comprising:

preparing a substrate in a chamber;

forming a first material layer including a silicon nitride (SiNx) on the substrate;

forming a second material layer including a silicon oxide (SiOx) on the first material layer; and forming a third material layer including the silicon nitride (SiNx) on the second material layer, wherein the forming of the first material layer, the forming of the second material layer, and the forming of the third material layer are performed by plasma-enhanced atomic layer deposition (PEALD), the method further comprising providing a fourth plasma having an atmosphere of nitrogen ($N_2$) or ammonia (NH), after the forming of the first material layer and before the forming of the second material layer, for improved interfacial stability between the first material layer and the second material layer, and providing a fifth plasma having an atmosphere of oxygen ($O_2$) and argon (Ar), after the forming of the second material layer and before the forming of the third material layer, for improved interfacial stability between the second material layer and the second material layer, wherein the first material layer, the second material layer, and the third material layer are all formed using diisopropylamino silane (DIPAS) having a structure represented by Chemical Formula 1, wherein a pressure of a first plasma used to form the first material layer and a pressure of a third plasma used to form the third material layer are higher than a pressure of a second plasma used to form the second material layer, and a exposure time of the first and third plasma used to form the first and third material layer is longer than a exposure time of the second plasma used to form the second material layer, <Chemical Formula 1>

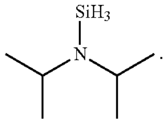

2. The method of claim 1, wherein the forming of the first material layer includes:

providing a first precursor including diisopropylamino silane (DIPAS) in the chamber and adsorbing the first precursor onto the substrate;

purging the first precursor remaining in the chamber by using a nitrogen gas;

forming the first material layer by providing the first plasma in an atmosphere in which the nitrogen gas is provided to allow the first precursor adsorbed onto the substrate to react with the nitrogen gas; and purging a residue inside the chamber by using the nitrogen gas, the providing of the first precursor, the purging of the first precursor, the forming of the first material layer, and the purging of the residue are defined as one unit process, and the unit process is repeatedly performed.

3. The method of claim 1, wherein the forming of the second material layer includes:

providing a second precursor including diisopropylamino silane (DIPAS) in the chamber and adsorbing the second precursor onto the substrate;

purging the second precursor remaining in the chamber by using an argon gas;

providing a mixed gas including the argon gas and an oxygen gas in the chamber;

forming the second material layer by providing the second plasma in an atmosphere in which the mixed gas is provided to allow the second precursor adsorbed onto the substrate to react with the oxygen gas; and purging a residue inside the chamber by using the argon gas, the providing of the second precursor, the purging of the second precursor, the providing of the mixed gas, the forming of the second material layer, and the purging of the residue are defined as one unit process, and the unit process is repeatedly performed.

4. The method of claim 1, wherein the forming of the third material layer includes:

providing a third precursor including diisopropylamino silane (DIPAS) in the chamber and adsorbing the third precursor onto the substrate;

purging the third precursor remaining in the chamber by using a nitrogen gas;

forming the third material layer by providing the third plasma in an atmosphere in which the nitrogen gas is provided to allow the third precursor adsorbed onto the substrate to react with the nitrogen gas; and purging a residue inside the chamber by using the nitrogen gas, the providing of the third precursor, the purging of the third precursor, the forming of the third material layer, and the purging of the residue are defined as one unit process, the unit process is repeatedly performed, the third plasma is provided under a same pressure condition as the first plasma, and the third plasma is provided for a same time as the first plasma.

* * * * *